United States Patent [19]

Kemmer et al.

[11] Patent Number: 5,786,609
[45] Date of Patent: Jul. 28, 1998

[54] INTEGRATED HORIZONTAL UNIPOLAR TRANSISTOR HAVING A DOPED LAYER FORMING AN INTERNAL GATE OF THE TRANSISTOR AND AT LEAST ONE INTEGRATED CAPACITOR HAVING A FIRST ELECTRODE CONNECTED TO A SOURCE OF THE TRANSISTOR AND A SECOND ELECTRODE TO THE FIXED POTENTIAL

[75] Inventors: Josef Kemmer, Oberschleissheim; Gerhard Lutz; Rainer Richter, both of Munich; Karl-Ernst Ehwald, Frankfurt an der Oder, all of Germany

[73] Assignee: Max-Planck-Gesellschaft zur Foerderung der Wissenschaflen e.V., Munich, Germany

[21] Appl. No.: 615,234

[22] PCT Filed: Sep. 15, 1994

[86] PCT No.: PCT/DE94/01066

§ 371 Date: May 23, 1996

§ 102(e) Date: May 23, 1996

[87] PCT Pub. No.: WO95/08190

PCT Pub. Date: Mar. 23, 1995

[30] Foreign Application Priority Data

Sep. 15, 1993 [DE] Germany .................. 43 31 391.4

[51] Int. Cl.$^6$ ........................................ H01L 29/80
[52] U.S. Cl. .......................... 257/257; 257/258; 257/462; 257/136
[58] Field of Search ........................ 257/134, 136, 257/141, 159, 459, 460, 461, 462, 256, 257, 258

[56] References Cited

FOREIGN PATENT DOCUMENTS

| 0 042 218 | 12/1981 | European Pat. Off. . |
| 0 094 974 | 11/1983 | European Pat. Off. . |
| 2 563 657 | 10/1985 | France . |
| 29 52 513 | 7/1980 | Germany . |
| 33 45 190 | 6/1984 | Germany . |
| 1 444 541 | 8/1976 | United Kingdom . |

*Primary Examiner*—Minh-Loan Tran
*Attorney, Agent, or Firm*—Evenson, McKeown, Edwards & Lenahan P.L.L.C.

[57] ABSTRACT

A semiconductor detector structure consists of a unipolar or single-pole transistor disposed or arranged on a substantially depleted semiconductor body, with a drain, a source, a resetting contact, a top gate and a potentially floating layer forming at least one gate of the unipolar transistor, as well as at least one capacitor. The source is directly connected to the first electrode or electrodes of the capacitor or capacitors. The capacitor or the capacitors are integrated jointly with or into the semiconductor structure.

15 Claims, 7 Drawing Sheets

INTEGRATED HORIZONTAL UNIPOLAR TRANSISTOR HAVING A DOPED LAYER FORMING AN INTERNAL GATE OF THE TRANSISTOR AND AT LEAST ONE INTEGRATED CAPACITOR HAVING A FIRST ELECTRODE CONNECTED TO A SOURCE OF THE TRANSISTOR AND A SECOND ELECTRODE TO THE FIXED POTENTIAL

FIELD OF THE INVENTION

The present invention proposes a semiconductor structure having both detector and amplifier properties. Such structures are known from earlier patent applications and also from prior art literature. They are suitable for application as independent detectors, as integrated read-out structures of other semiconductor detectors such as drift chambers, drift diodes or CCDs, and particularly as fundamental elements of image cell detectors.

BACKGROUND OF THE INVENTION

In all of these known applications, read-out is performed by comparing the current flow of the unipolar transistor, with and without signal charge which is collected in a potential minimum (negative charge maximum) underneath the transistor channel, i.e., the "internal gate". The system is reset (quenching of the signal charge) either by application of a voltage pulse (positive for stored electrons) at a reset electrode or by a continuous "overflow" of the almost filled potential reservoir.

One problem in the application of this detector principle occurs in arrays using a plurality of these detector amplifier structures. This is the case, for example, with image cell detectors. There, the individual transistors are intended to operate on the lowest static current possible so as to reduce the energy consumption. With threshold voltage variations occurring in the individual transistors in general, even though the transistors are operated on the same voltages, it is not possible to reduce the power consumption of the system in its entirety to an optional minimum. Apart therefrom, different static currents may result in different slopes and hence also different signal gains as well as "offsets".

It is therefore the object of the present invention to operate the detector amplifier structure in the charge collection state near the threshold so that the power consumption in this state will be very low. It is intended that this state establishes itself automatically, substantially independently of the applied voltage or the threshold voltage of the transistor, respectively.

SUMMARY OF THE INVENTION

In accordance with the present invention, this problem is solved by the provision that the source of the transistor is connected to an external source via a capacitance element rather than directly. The mode of operation will be explained with reference to a p-channel DEPFET structure. However, other structures are also contemplated. The source is connected to the capacitor whose second electrode is connected to a fixed potential $V_K$ (e.g. ground potential). The capacitance is integrated into the structure.

DETAILED DESCRIPTION OF THE DRAWINGS

Figure 1:
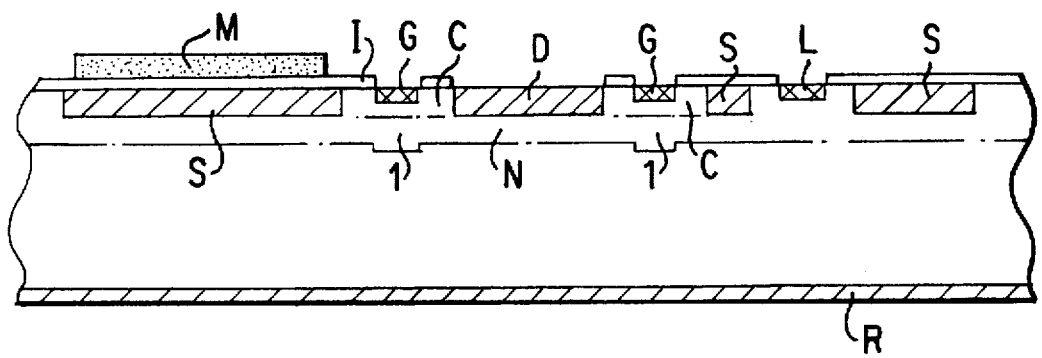
FIG. 1 is a top plan and cross-section view of an embodiment according to the present invention.
Figure 1B:
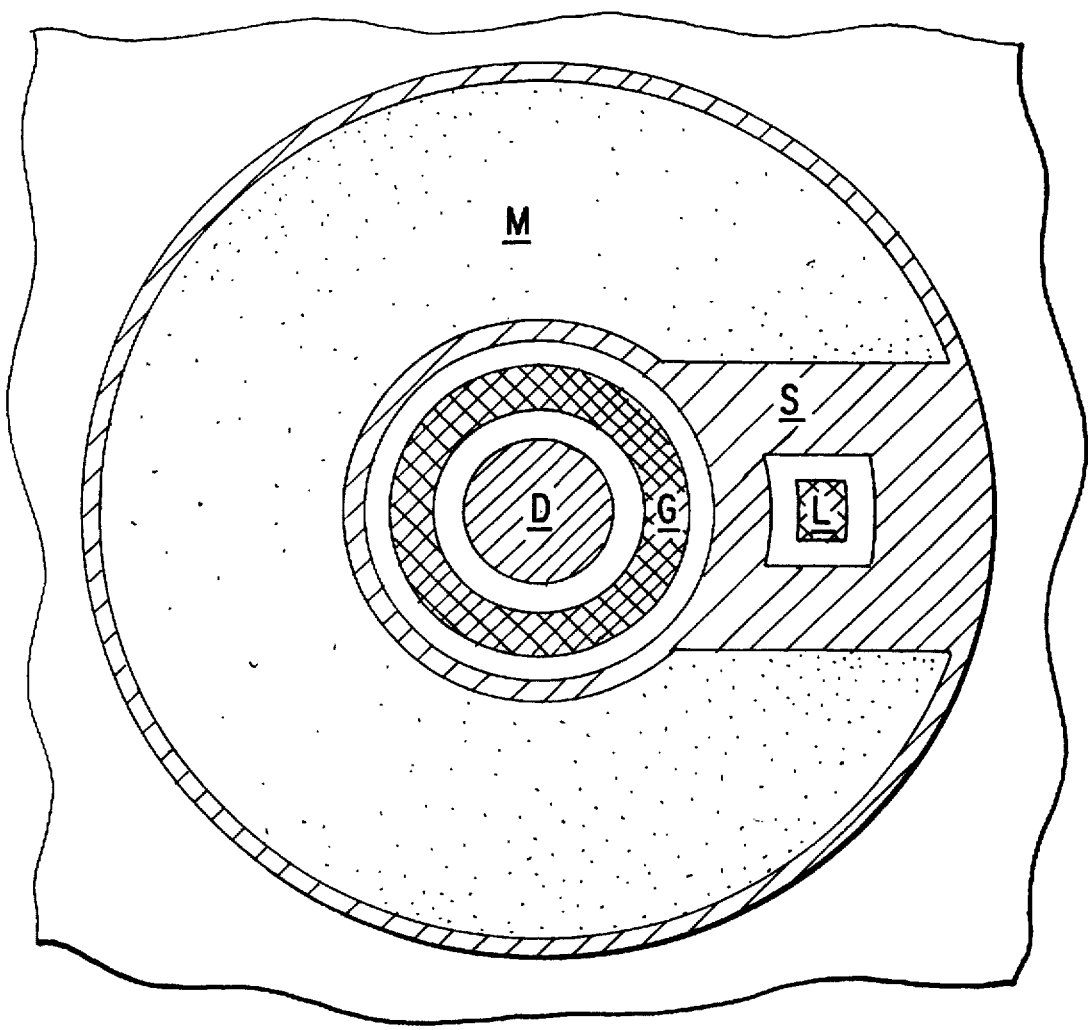

One example of the integration according to the invention is shown in FIG. 1, which represents a closed (annular) transistor structure in a substantially completely depleted semiconductor body with n-type doping, in both a cross-sectional and a plan view. The gate (G) and the source (S) can therefore be seen on both sides of the centrally disposed drain (D); a small reset electrode (L) is provided on the right side in the source. The return contact (R) serves to deplete the semiconductor body of charge carriers and to form a potential barrier underneath the upper major face of the structure.

A large-area amplification (N) of the n-type doping causes at the same time the formation of a potential maximum (1) between the source and the drain, while it prevents hole injections from p-areas on the upper side into the lower side when, in response to the application of a negative voltage to the return contact (R), the potential maximum is shifted into the vicinity of the upper major face. The potential maximum below the gate may be amplified even more by additional local n-type implants. The source implantation area (on the left side in the illustration) serves, at the same time, as a first electrode of the capacitance. The capacitance $C_S$ is formed in cooperation with the dielectric (I) and the second (metal) electrode (M) adapted for external connection and disposed thereabove.

The dielectric I is not shown in the plan view. Another example of the integration of the capacitor will be discussed in the following. The description of the functions starts out from an original state in which the drain D is connected to ground potential while the gate G is connected to a fixed potential $V_G$ so that the source and the drain are conductively connected to each other via the channel C. A sufficient negative potential is applied to the return contact R so that the semiconductor with its n-type doping is substantially depleted. If now a negative voltage $V_D$ is applied to the drain, a drain current flows which comes to a standstill when the source has achieved a sufficient negative voltage so that the transistor is then non-conducting.

The detector amplifier structure may then be maintained in this almost currentless state. When, e.g. in response to incident ionizing radiation, a negative charge is collected in the potential maximum underneath the gate, the transistor channel becomes conducting again and will be non-conducting again only when an appropriately more negative source voltage has been achieved. The charge transferred in the generated current pulse corresponds to the signal charge amplified by the factor $\approx C_S/C_G$, with $C_G$ representing the gate channel capacitance. The amplified signal charge is read out immediately, e.g. by metering the drain current, in the aforedescribed manner. It may, however, also be read out with a delay when, following the establishment of the equilibrium state, the gate is shifted to more positive values. Then, the additional signal charge does not cause a current flow. This flow occurs only when the gate voltage is reset to the original value. An array including a great number of detector amplifier structures thus allows for serial read-out if the gate voltages are varied with an offset in time. Additionally, the setting of a more negative gate voltage may additionally accelerate the read-out operation.

The signal charges may be quenched with the application of already known methods, or by means of a new structure which will be discussed below.

After the signal charge has been quenched, the structure is insensitive (at least to fairly small signals). It is necessary to reset the capacitance $C_S$. This may be achieved in different ways. The simplest design provides for a transient variation of the drain voltage $V_D$ in the positive direction up to a value at which the drain and source functions are interchanged. Thus, the source voltage re-establishes itself to the original value again. The net charge then flowing corresponds to the amplified signal charge and may therefore also be used for its determination.

Another possibility of source resetting consists in the generation of electron-hole pairs in the region between the source or channel, respectively, and the gate or any other positive contact (e.g. the return contact). This may be achieved, for instance, by transient illumination. Even a permanent long-term illumination or a reduction of the life of minority carriers in the vicinity of the surface may be of interest. Hence, the structures may be continuously operated near the threshold in the case of low currents. For a restriction of the generation of charge carriers by light incident on specific areas, e.g. the immediate vicinity of the source, an opaque layer having local openings may be applied on the upper side of the semiconductor structure.

Various methods of resetting the signal charge have been described in the prior art. Mostly, an n⁺-type contact is disposed near (or inside) the drain or the source, and a positive voltage pulse is applied to vary the potential in the semiconductor body so as to cause the transient disappearance (or at least a reduction) of the potential maximum underneath the gate and to cause the signal charge to drain towards the reset contact. A continuous slow drain is possible, too, if a small reset contact is disposed which is out of symmetry relative to the source. Then, the signal charge drains only at one site along the width of the channel (slowly) to the reset contact. All of these resetting structures present the disadvantage that the potential inside the semiconductor (the detector region) is influenced by the quenching process, or even by the presence of the resetting electrode already (in the case of continuous quenching). With the potential of the resetting electrode being often more positive than the potential of the internal gate, at least one part of the generated signal charge will drain directly to the reset contact during the quenching process so that it is no longer available for a subsequent measurement.

Figure 2:
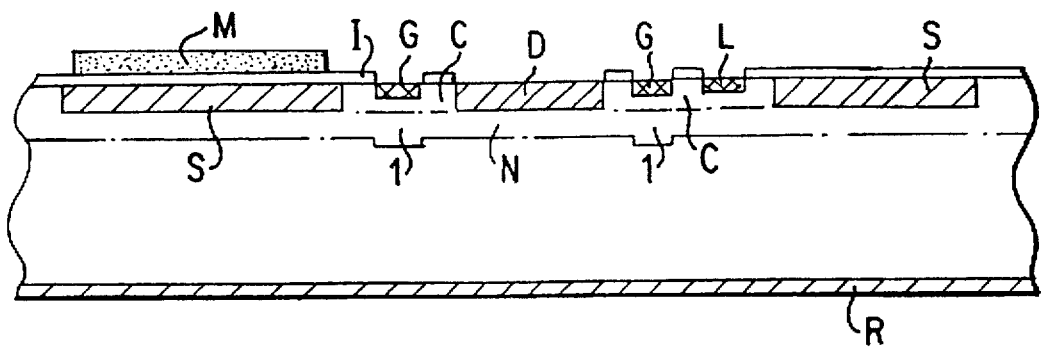
FIG. 2 is a top plan and cross-section view of another embodiment according to the present invention.
Figure 2A:
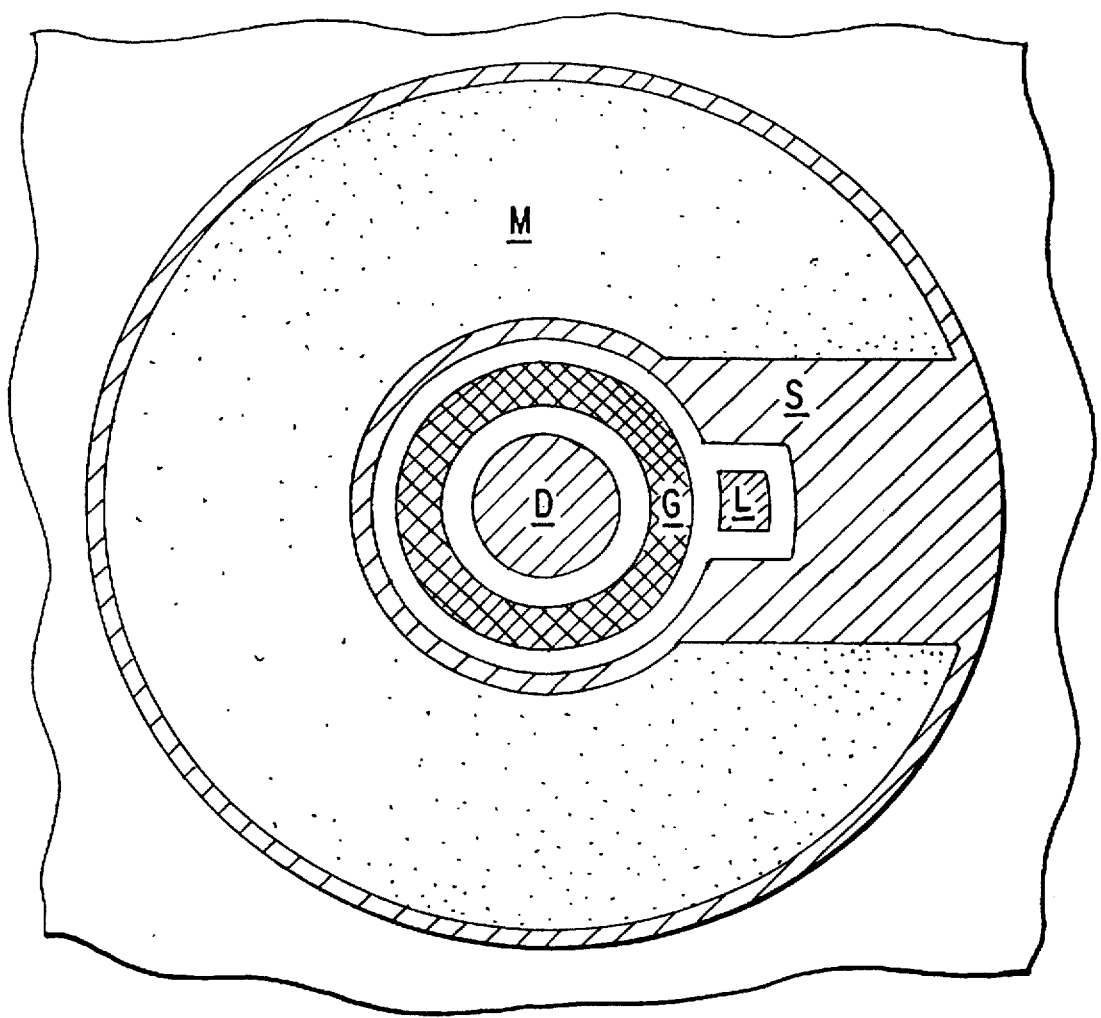

FIG. 2 shows a resetting structure which avoids these disadvantages. It consists of an n⁺-type contact (L) which is mounted on the surface in the vicinity of the potential maximum (1) where the signal charges (electrons) are collected. It is isolated from the signal charges by the channel (C) having a p-type doping. In the illustrated example, it is provided at a local site between the source (S) and the gate (G) of the structure having a substantially annular configuration. The signal charge may now be quenched by the application of a positive pulse beyond the potential barrier which is established by the channel implantation (C). It is even more interesting to select a suitable constant positive voltage at the resetting contact (L), however, so as to ensure the continuous drain.

Figure 4A:
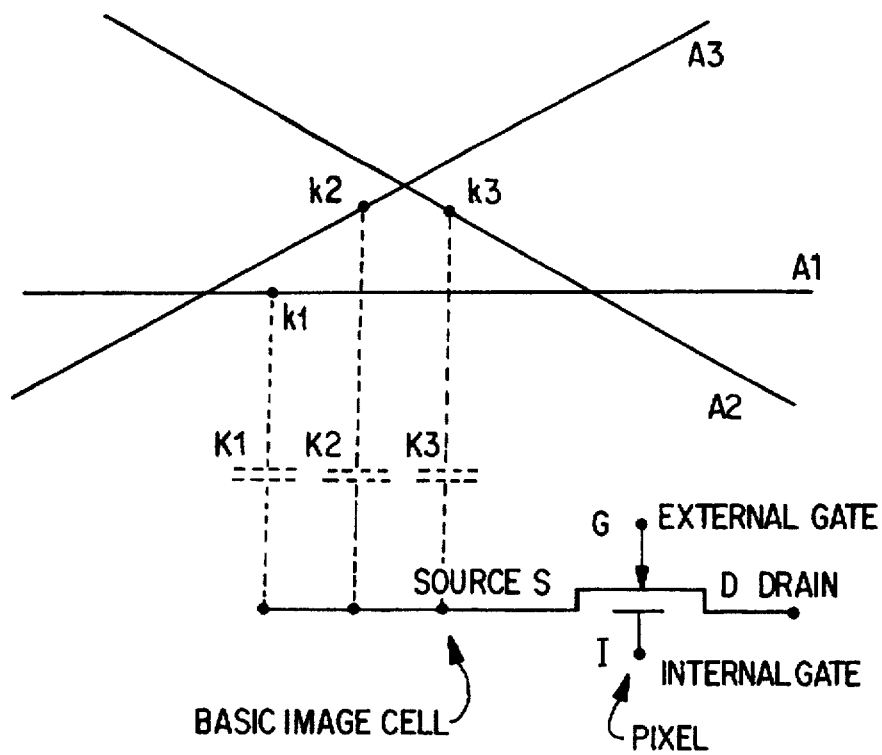
FIG. 4A is a graph illustrating nodes connected by contacts to selection lines extending in different directions in correspondence with an equivalent circuit diagram and FIG. 4B illustrates an image cell detector formed of basic image cells.
Figure 4B:
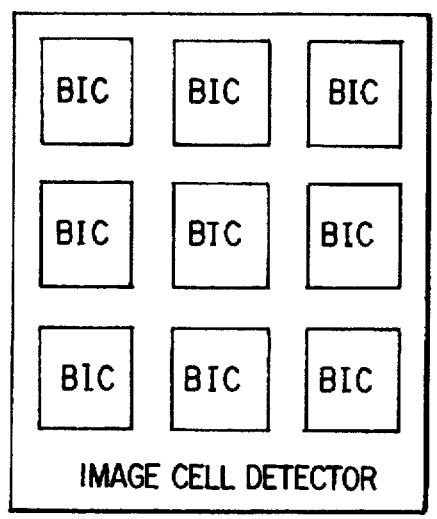

In the embodiments so far described, the source of the basic structure is connected to a defined potential via one capacitance element each. It is also possible, however, to split the capacitance into several sub-capacitances which are each connected to another electrode (possibly at a different potential). The amplified signal is then split with the capacitance ratio, and may be processed several times. This may be of interest, for example, in the case of image cell detectors (FIG. 4B) composed of a basic cell matrix in which capacitors of various basic elements are interconnected through selection lines. If several capacitors (e.g. three) are provided per basic cell, then it is possible to use several selection lines extending in different (three) directions. When this array is actually operated in the threshold state, the signal of one particle is incident on several selection lines so that an unambiguous position allocation is possible even in the case of simultaneous incidence of several particles.

Figure 3:
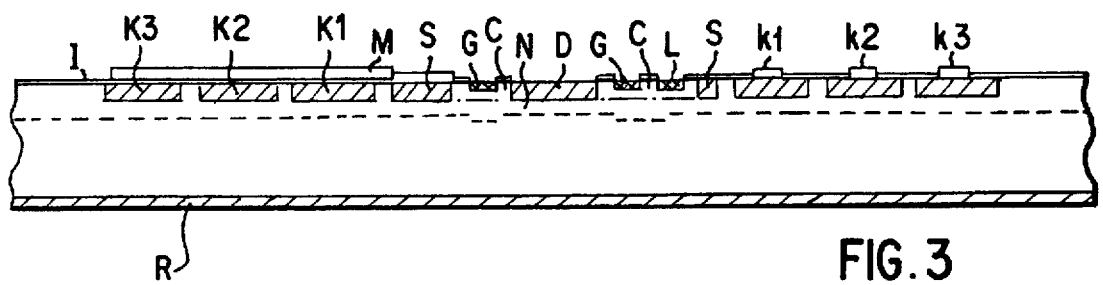
FIG. 3 is a top plan and cross-section view of yet another embodiment according to the present invention.
Figure 3A:
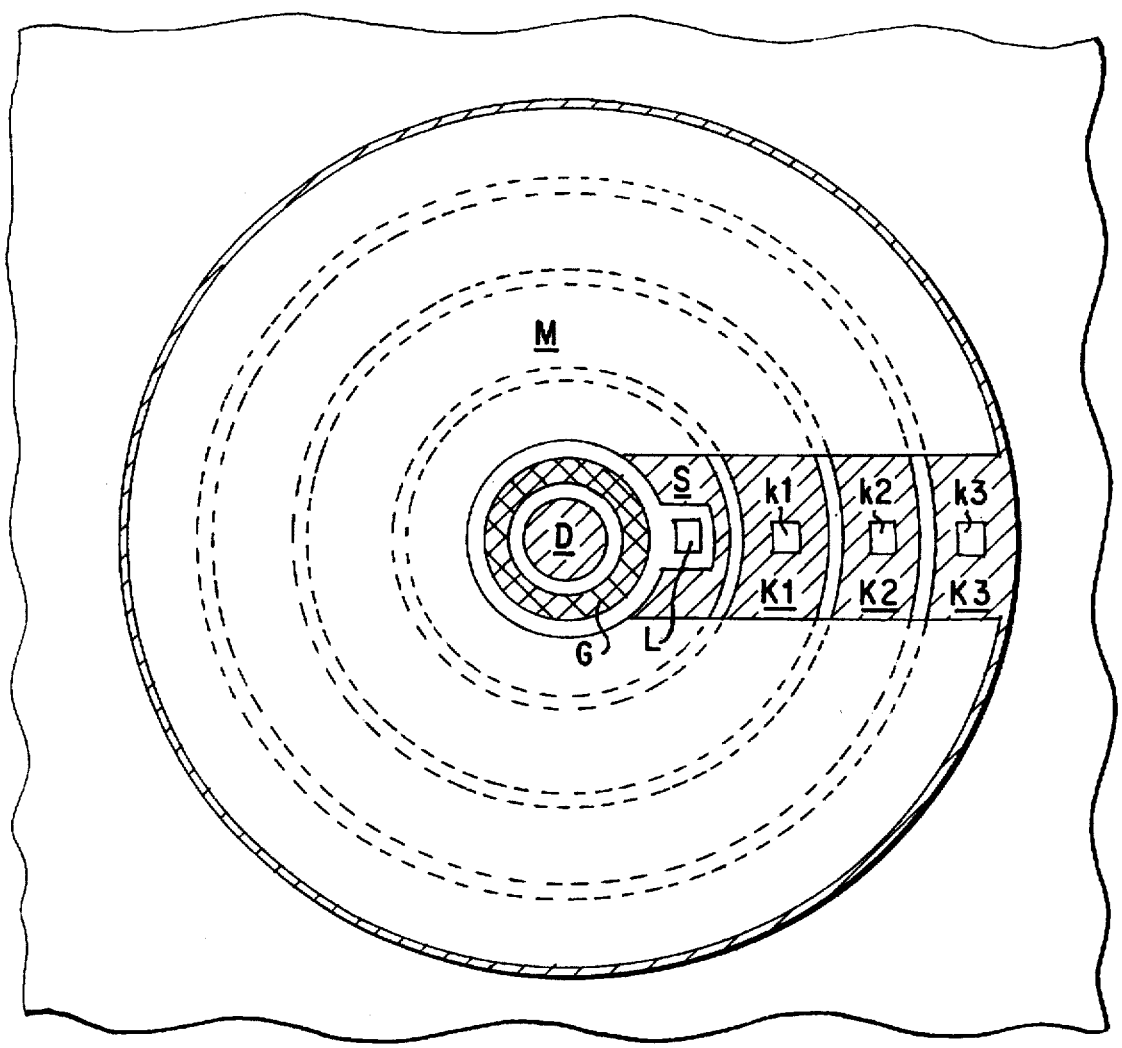

FIG. 3 shows one example of the fundamental structure of such an array. The cross-sectional view taken through a closed basic structure shows, in the left part, the formation of the capacitance elements occupying the majority of the surface while the right part shows the terminals (k1, k2, k3) for connection of the selection lines. The first electrode of the capacitance elements, which is connected to the source, is configured as metal electrode (M) above the dielectric (I). The second electrodes of the capacitance elements, which are connected to the selection lines, present an annular configuration and are disposed as implanted areas (K1, K2, K3) in the substrate. The nodes k1, k2 and k3 are connected by contacts to selection lines (A1, A2, A3) extending in different directions, in correspondence with the equivalent circuit diagram (see FIG. 4A). When different voltages are applied to the selection lines extending in different directions in this array, it is possible to generate a drift field which guides the signal electrons to the potential maximums underneath the gates, thus reducing the charge collection period. In this array, in which the second electrodes are provided as implants in the semiconductor, it is moreover possible to cross the selection lines extending in different directions without the inclusion of an additional wiring plane.

Figure 5:
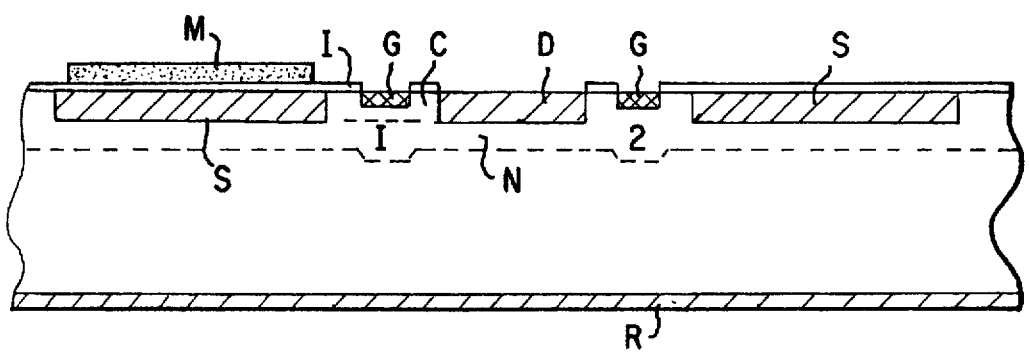
FIG. 5 is a top plan and cross-section view of still yet another embodiment according to the present invention.
Figure 5A:
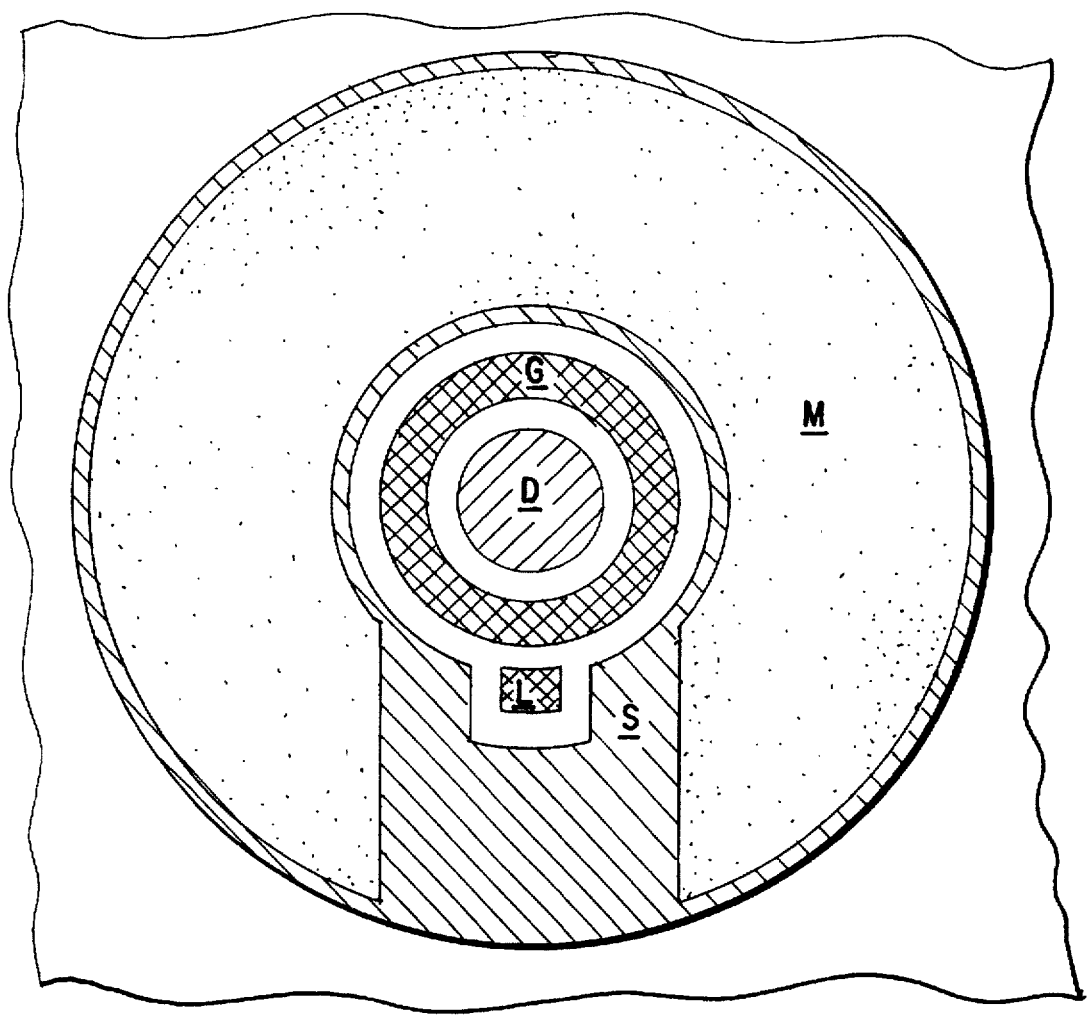

In the embodiments so far described, the top gate (G) was connected to an external voltage. It is also possible, however, to interconnect the top gate with the internal gate (1) (potential maximum partially charged with electrons). In the example shown in FIG. 5, this is achieved by the omission of the channel doping (C) underneath one part of the gate (2, on the right side in the cross-section view). The potential of this gate, so interconnected, is preset by the resetting operation. The signal charge may be quenched both continuously and in a pulsed manner. One advantage of this array resides in the aspect that the selection line for the top gate (G) may be omitted. The structure for quenching the signal charge is not shown in the illustration. Another advantage of this array is its increased control effect produced by the signal charge on the channel, as well as an increased signal rising rate, particularly when the transistor is operated near the threshold.

Figure 6:
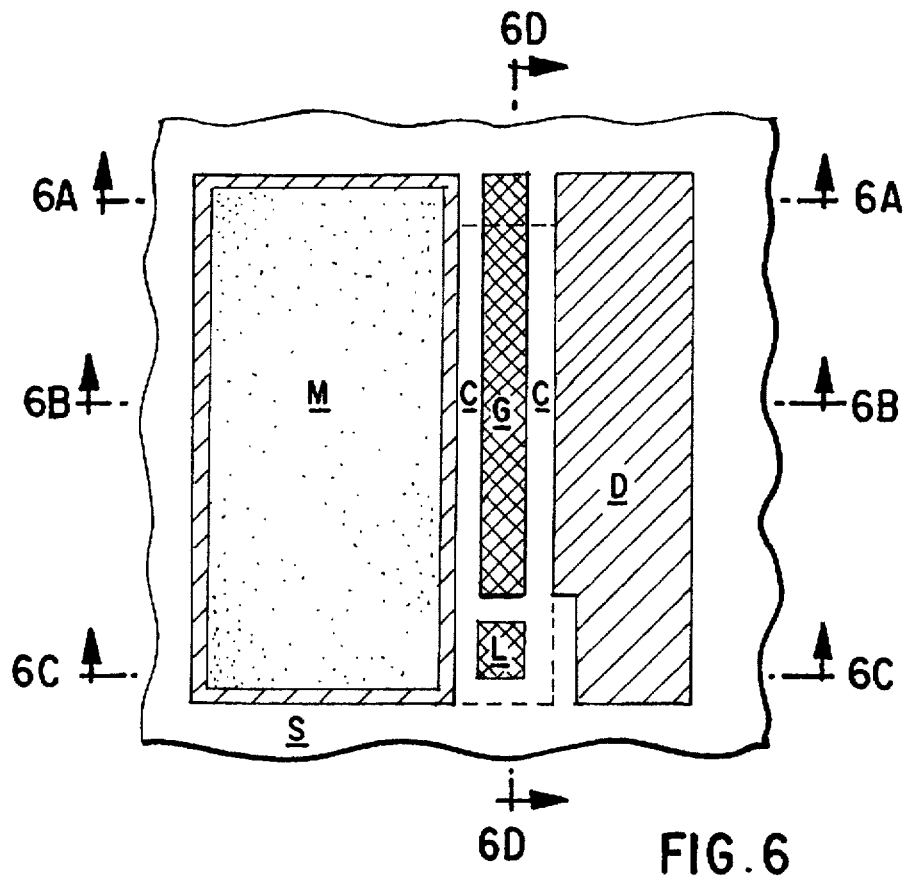
FIG. 6 is a top plan and four cross-sectional views thereof of another embodiment according to the present invention.
Figure 6A:
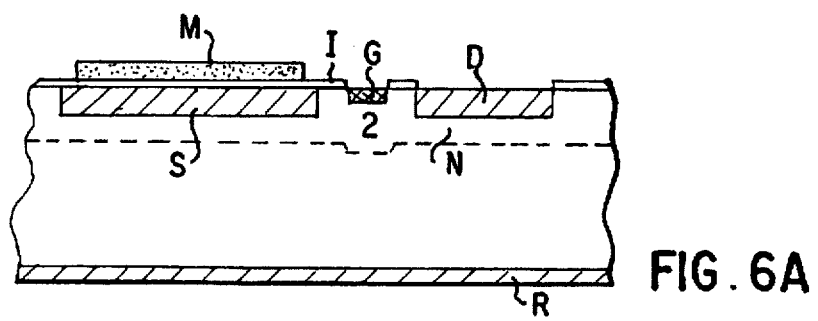
Figure 6B:
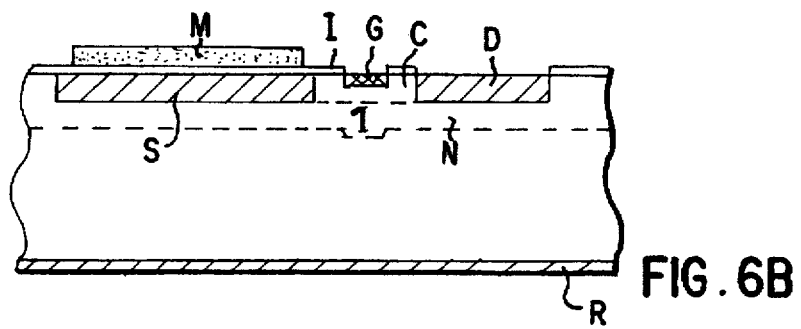
Figure 6C:
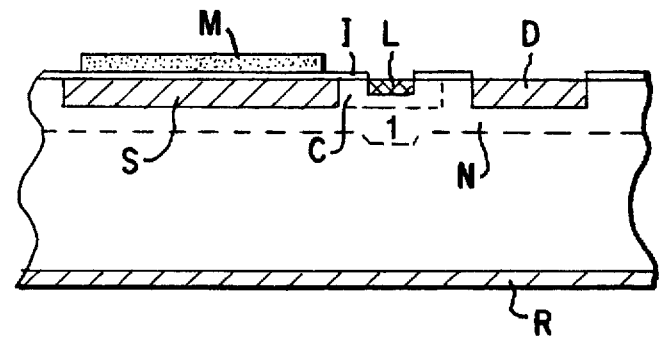
Figure 6D:
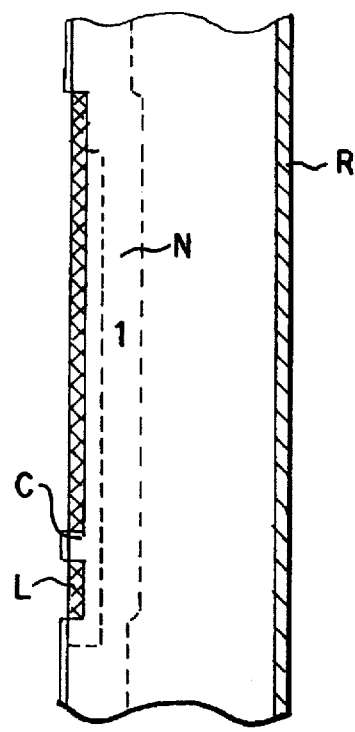

For the embodiments so far described, annular structures have been shown. Of course, other geometries are also contemplated such as rectangular or hexagonal structures which are expedient e.g. in cases where large areas of image cell detectors are to be completely covered. FIG. 6 shows one example of such a design. In this structure, the internal (1) and the external (G) gates are connected to each other (cross-section A—A). In the area of the resetting electrode (cross-section C), the channel is not continuously implanted (C) between the source and the drain. The transistor current is hence restricted to the central region (cross-section C—C) where the control effect of the external and internal gate is achieved simultaneously.

In the illustrated embodiments, only p-type channel junction field effect transistors (p-type JFETs) on an n-type doped substrate have been shown. It goes without saying, however, that it is also possible to use n-type channel transistors on a p-type substrate. It is moreover possible to operate on depletion- or accumulation-type MOS transistor structures and also unipolar transistors.

What is claimed is:

1. A semiconductor structure having a semiconductor body, comprising:
   a unipolar transistor integrated into the semiconductor body, said unipolar transistor including a drain, a source, a top gate, a resetting contact, and a doped layer, said layer forming at least one gate of the unipolar transistor;
   at least one capacitor having a first electrode directly connected to the source of the unipolar transistor;
   wherein said unipolar transistor is a horizontal transistor applied on a first major face of the semiconductor body and having a channel disposed in parallel with the first major face;
   wherein a return contact is disposed on a second major face of the semiconductor body, said return contact serving to deplete the semiconductor body of charge carriers and to form a potential barrier underneath the first major face; and
   wherein a second electrode of the at least one capacitor is connected to a fixed potential.

2. The semiconductor structure according to claim 1, wherein said unipolar transistor is one of a depletion and accumulation-type MOS transistor.

3. The semiconductor structure according to claim 1, wherein said unipolar transistor is a junction field effect transistor.

4. The semiconductor structure according to claim 1, wherein the first electrode of the at least one capacitor is formed by a doped source of said unipolar transistor.

5. The semiconductor structure according to claim 1, wherein said source is connected through several capacitors to externally accessible contacts.

6. The semiconductor structure according to claim 5, wherein second electrodes of said several capacitors are formed by doped areas in the semiconductor body.

7. The semiconductor structure according to claim 1, wherein said top gate and said doped layer are electrically interconnected in order to form together a potentially floating area.

8. The semiconductor structure according to claim 1, wherein said source is reset by a transient exchange of source and drain functions by varying a voltage applied at the electrodes.

9. The semiconductor structure according to claim 1, wherein a layer joins said source, said layer having a minority carrier life noticeably reduced relative to a life of a substrate material for the semiconductor structure.

10. The semiconductor structure according to claim 1, further comprising a light source disposed in a vicinity of the semiconductor structure functioning as a detector, said light source illuminating an environment of the source either with one of a pulse and continuous light.

11. The semiconductor structure according to claim 10, wherein an opaque layer is provided on an upper side of the detector, said opaque layer having openings in a vicinity of said source.

12. The semiconductor structure according to claim 1, wherein said doped layer is an internal gate which is reset either in a pulsed or continuous manner through an n-p-n-type or a p-n-p-type structure, with areas of a same conductivity type constituting the internal gate as well as the resetting electrode.

13. The semiconductor structure according to claim 12, wherein a potential barrier for resetting via a mean doping of the n-p-n-type or the p-n-p-type structure is formed by a channel doping.

14. The semiconductor structure according to claim 1, wherein an image cell detector is formed with a matrix-type arrangement of the semiconductor structures, said image cell detector having image cells which are activated and read via selection lines.

15. The semiconductor structure according to claim 14, wherein the source of a respective pixel of the image cell detector is connected, via several capacitors, to said selection lines which are connected to the second electrodes of said several capacitors.

* * * * *